US010390111B2

(12) United States Patent
Yogeeswaran

(10) Patent No.: US 10,390,111 B2
(45) Date of Patent: Aug. 20, 2019

(54) SYSTEMS AND METHODS FOR MONITORING A POWERLINE CONDUCTOR USING AN ASSOCIATED FIBER OPTIC CABLE

(71) Applicant: Facebook, Inc., Menlo Park, CA (US)

(72) Inventor: Karthik Yogeeswaran, San Francisco, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 15/938,348

(22) Filed: Mar. 28, 2018

(65) Prior Publication Data
US 2019/0116403 A1 Apr. 18, 2019

Related U.S. Application Data

(60) Provisional application No. 62/573,470, filed on Oct. 17, 2017.

(51) Int. Cl.
H04Q 9/00 (2006.01)
H04B 10/2575 (2013.01)

(52) U.S. Cl.
CPC ........... *H04Q 9/00* (2013.01); *H04B 10/2575* (2013.01); *H04Q 2209/30* (2013.01)

(58) Field of Classification Search
CPC .... G01R 15/142; G01K 1/024; G01K 15/142; H01F 38/20; H01F 27/02
USPC ............. 340/870.16; 324/126, 127; 323/357; 336/176
See application file for complete search history.

(56) References Cited

U.S. PATENT DOCUMENTS 2,685,068 A 7/1954 Goubau
4,709,339 A * 11/1987 Fernandes .............. G01K 1/024
324/127
(Continued)

FOREIGN PATENT DOCUMENTS

CN 104111404 A 10/2014
CN 204408639 U 6/2015
(Continued)

OTHER PUBLICATIONS

"AccessWrap," AFL Telecommunications Europe Ltd. (May 9, 2012).
(Continued)

*Primary Examiner* — Albert K Wong
(74) *Attorney, Agent, or Firm* — FisherBroyles, LLP

(57) ABSTRACT

The disclosed system may include (1) a plurality of monitoring devices, where each of the plurality of monitoring devices is located at a different location along a powerline conductor and may include (a) at least one detection component that detects at least one physical characteristic at the location of the monitoring device along the powerline conductor, and (b) a transmitter that wirelessly transmits data indicating the at least one physical characteristic, and (2) a data injection device that (a) wirelessly receives the data indicating the at least one physical characteristic detected by the plurality of monitoring devices at the different locations along the powerline conductor, (b) transforms the data into an optical signal, and (c) injects the optical signal onto a fiber optic cable for transmission to a data collection subsystem. Various other systems and methods are also disclosed.

19 Claims, 7 Drawing Sheets

(56) References Cited

U.S. PATENT DOCUMENTS

| | | | |
|---|---|---|---|
| 4,799,005 A * | 1/1989 | Fernandes | G01K 1/024 |
| | | | 324/117 R |
| 4,801,937 A * | 1/1989 | Fernandes | G01R 15/142 |
| | | | 323/357 |
| 5,003,278 A * | 3/1991 | May | H01F 17/06 |
| | | | 174/92 |
| 5,426,360 A * | 6/1995 | Maraio | G01R 15/142 |
| | | | 324/126 |
| 5,727,373 A | 3/1998 | Appleford et al. | |
| 6,813,422 B1 | 11/2004 | Krishnamurthy et al. | |
| 8,411,259 B2 | 4/2013 | Levin et al. | |
| 8,786,292 B2 * | 7/2014 | Parsons | G01R 35/04 |
| | | | 324/127 |
| 8,831,394 B2 | 9/2014 | Kimbrell et al. | |
| 9,051,153 B2 | 6/2015 | Lichoulas et al. | |
| 9,255,821 B1 | 2/2016 | Miyamoto et al. | |
| 2004/0266332 A1 | 12/2004 | Lang | |
| 2005/0164666 A1 | 7/2005 | Lang et al. | |
| 2008/0077336 A1 | 3/2008 | Fernandes | |
| 2012/0027062 A1 * | 2/2012 | Garcia | H04B 3/544 |
| | | | 375/224 |
| 2014/0361785 A1 | 12/2014 | Radan | |
| 2016/0054363 A1 | 2/2016 | Rostron et al. | |
| 2017/0176703 A1 | 6/2017 | Baker et al. | |
| 2018/0143234 A1 * | 5/2018 | Saxby | G01R 31/021 |

FOREIGN PATENT DOCUMENTS

| | | |
|---|---|---|
| CN | 204964679 U | 1/2016 |
| CN | 106226603 A | 12/2016 |
| JP | 2002-345175 A | 11/2002 |
| WO | 99/58992 A2 | 11/1999 |
| WO | 2004/032277 A1 | 4/2004 |

OTHER PUBLICATIONS

"Application of Goubau Surface Wave Transmission Line for Improved Bench Testing of Diagnostic Beamline Elements," J. Musson et al., Proceedings of PAC09, Vancouver, BC, Canada, Ref. No. TH6REP047, pp. 4060-4062 (May 1, 2009).

"Fiber Optic Cable," AFL Telecommunications Europe Ltd.(Jun. 25, 2014).

"Power Line Aeolian Vibrations," J-L Lilien, Department of Electronics, Electricity, and Computer Sciences, Transmission and Distribution of Electrical Energy (Nov. 1, 2013).

"SkyWrap Information," AFL Telecommunications Europe Ltd. (Jul. 23, 2013).

"The Goubau Line—Surface Waves for Bench Testing of Beam Instrumentation at High Frequencies," F. Stulle et al., Proceedings of BIW 2012, Ref. No. TUPG007, pp. 146-148 (Nov. 1, 2012).

"Understanding OTDRs," Anritsu Company (Nov. 1, 2011).

MW90010A Coherent OTDR, Anritsu Company (Jan. 26, 2015).

Karthik Yogeeswaran, et al.; Systems and Methods for Distributed Sensing of a Powerline Conductor ; U.S. Appl. No. 15/938,332, filed Mar. 28, 2018.

International Search Report and Written Opinion received for PCT Application Serial. No. PCT/US2018/056149 dated Feb. 19, 2019, 12 pages.

International Search Report and Written Opinion received for International Patent Application Serial No. PCT/US2018/056143 dated Jan. 28, 2019, 11 pages.

* cited by examiner

SYSTEMS AND METHODS FOR MONITORING A POWERLINE CONDUCTOR USING AN ASSOCIATED FIBER OPTIC CABLE

CROSS REFERENCE TO RELATED APPLICATION

This application claims the benefit of U.S. Provisional Application No. 62/573,470, filed Oct. 17, 2017, the disclosure of which is incorporated in its entirety, by this reference.

BACKGROUND

Typical electrical transmission and distribution systems often include some form of monitoring equipment to detect severed powerlines and other anomalies. Typically, such equipment may include head-end line monitoring gear in either or both of the transmission space (e.g., where powerline conductors traditionally carry thousands of volts over long distances) and at the substation level (e.g., where higher voltages are often converted to lower voltages prior to distribution to consumers). In addition, in some circumstances, "smart" meters installed at the customer premises may collect data regarding voltage levels, power consumption, and so on.

Consequently, data regarding the current operational status of large portions of the transmission and distribution systems tends to be coarse-grained due at least in part to the location of the monitoring gear. For examples, in an electrical transmission system, current supervisory control and data acquisition (SCADA) systems may detect when a particular powerline conductor has failed, but the particular location of the failure may be difficult to ascertain due to the expanse over which the conductor may extend. Similarly, due to the potentially large number of branching circuits sometimes involved in a distribution system, determining a particular location or cause of a failure in such a system may also prove to be problematic, possibly causing a significant amount of time and expense to identify accurately.

SUMMARY

As will be described in greater detail below, the instant disclosure describes systems and methods for monitoring a powerline conductor using an associated fiber optic cable. In one example, a system may include (1) a plurality of monitoring devices, where each of the plurality of monitoring devices is located at a different location along a powerline conductor and may include (a) at least one detection component that detects at least one physical characteristic at the location of the monitoring device along the powerline conductor, and (b) a transmitter that wirelessly transmits data indicating the at least one physical characteristic, and (2) a data injection device that (a) wirelessly receives the data indicating the at least one physical characteristic detected by the plurality of monitoring devices at the different locations along the powerline conductor, (b) transforms the data into an optical signal, and (c) injects the optical signal onto a fiber optic cable for transmission to a data collection subsystem. In some examples, at least one of the plurality of monitoring devices may further include a receiver that wirelessly receives, from another of the plurality of monitoring devices, data indicating the at least one physical characteristic at the location of the other of the plurality of monitoring devices along the powerline conductor, and the transmitter of the at least one of the plurality of monitoring devices wirelessly retransmits the data wirelessly received from the other of the plurality of monitoring devices.

In some examples, the system may further include a plurality of clamping devices that clamp the fiber optic cable to the powerline conductor, where each of one or more of the plurality of clamping devices includes at least one of the plurality of monitoring devices. In some embodiments, the at least one physical characteristic may include at least one electrical characteristic of power carried on the powerline conductor, such as, for example, at least one of voltage or current. Also in some examples, the at least one physical characteristic may include at least one characteristic of an environment including the powerline conductor, such as at least one of temperature, humidity, or wind speed.

In some embodiments, the system may further include an optical fiber splice case that includes the data injection device. Also, in some examples, the data injection device may include (1) an electrical-to-optical signal converter that transforms the data into the optical signal, and (2) an optical add/drop multiplexer that injects the optical signal onto a single wavelength of a single fiber of the fiber optic cable. Moreover, in some examples, the electrical-to-optical signal converter may include (1) an electronic interface protocol transceiver that converts the data into an electronic interface protocol signal, and (2) a single-fiber, single-wavelength optical transceiver that transforms the electronic interface protocol signal into a single-wavelength optical signal. Additionally, in some embodiments, the single-fiber, single-wavelength transceiver may include a small form-factor pluggable transceiver.

At least one of the plurality of monitoring devices, in some embodiments, may include (1) a detection circuit that detects a characteristic of power carried on the powerline conductor, and (2) a communication timing circuit that causes the transmitter of the at least one of the monitoring devices to wirelessly transmit the data indicating at least one physical characteristic at the location of each of the at least one of the plurality of monitoring devices along the powerline conductor according to a timing that is based on the characteristic of power carried on the powerline conductor. Further, in some examples, the characteristic of power carried on the powerline conductor detected by the detection circuit may include a zero-crossing of a voltage carried on the powerline conductor. In some embodiments, the data injection device may include (1) a detection circuit that detects a characteristic of power carried on the powerline conductor, and (2) a communication timing circuit that causes the data injection device to wirelessly receive the data indicating the at least one physical characteristic from at least one of the monitoring devices according to the timing that is based on the characteristic of power carried on the powerline conductor.

In some examples, one or more of the at least one detection component of at least one of the plurality of monitoring devices may sample the at least one physical characteristic multiple times per cycle of a current or a voltage carried by the powerline conductor.

In one example, a method may include (1) detecting, by a plurality of monitoring devices located at corresponding ones of multiple locations along a powerline conductor, at least one physical characteristic associated with the powerline conductor, (2) wirelessly transmitting, by the plurality of monitoring devices, data indicating the at least one physical characteristic associated with the powerline conductor, (3) wirelessly receiving, by a data injection device, the data indicating the at least one physical characteristic associated with the powerline conductor, (4) transforming, by the data injection device, the data into an optical signal, and (5) injecting, by the data injection device, the optical signal onto a fiber optic cable for transmission to a data collection subsystem. In some embodiments, the method may further include (1) wirelessly receiving, by at least one of the plurality of monitoring devices from another of the plurality of monitoring devices, data indicating the at least one physical characteristic associated with the powerline conductor at the location of the other of the plurality of monitoring devices, and (2) wirelessly retransmitting, by the at least one of the plurality of monitoring devices, the data wirelessly received from the other of the plurality of monitoring devices. The method may also include, in some examples, detecting, by at least one of the plurality of monitoring devices, a characteristic of power carried on the powerline conductor, where a timing of wirelessly transmitting the data indicating the at least one physical characteristic associated with the powerline conductor by the at least one of the plurality of monitoring devices is based on detecting the characteristic of power carried on the powerline conductor.

In another example, a method may include (1) installing a fiber optic cable alongside at least a portion of a powerline conductor, and (2) installing each of a plurality of clamping devices at a corresponding location along the fiber optic cable to secure the fiber optic cable to the powerline conductor, where at least one of the plurality of clamping devices may include a monitoring device that (a) detects at least one physical characteristic associated with the powerline conductor at the corresponding location along the fiber optic cable, and (b) wirelessly transmits data indicating the at least one physical characteristic associated with the powerline conductor at the corresponding location along the fiber optic cable. Additionally, in some embodiments, the method may include installing a data injection device that (1) wirelessly receives the data indicating the at least one physical characteristic, (2) transforms the data into an optical signal, and (3) injects the optical signal onto the fiber optic cable for transmission to a data collection subsystem.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
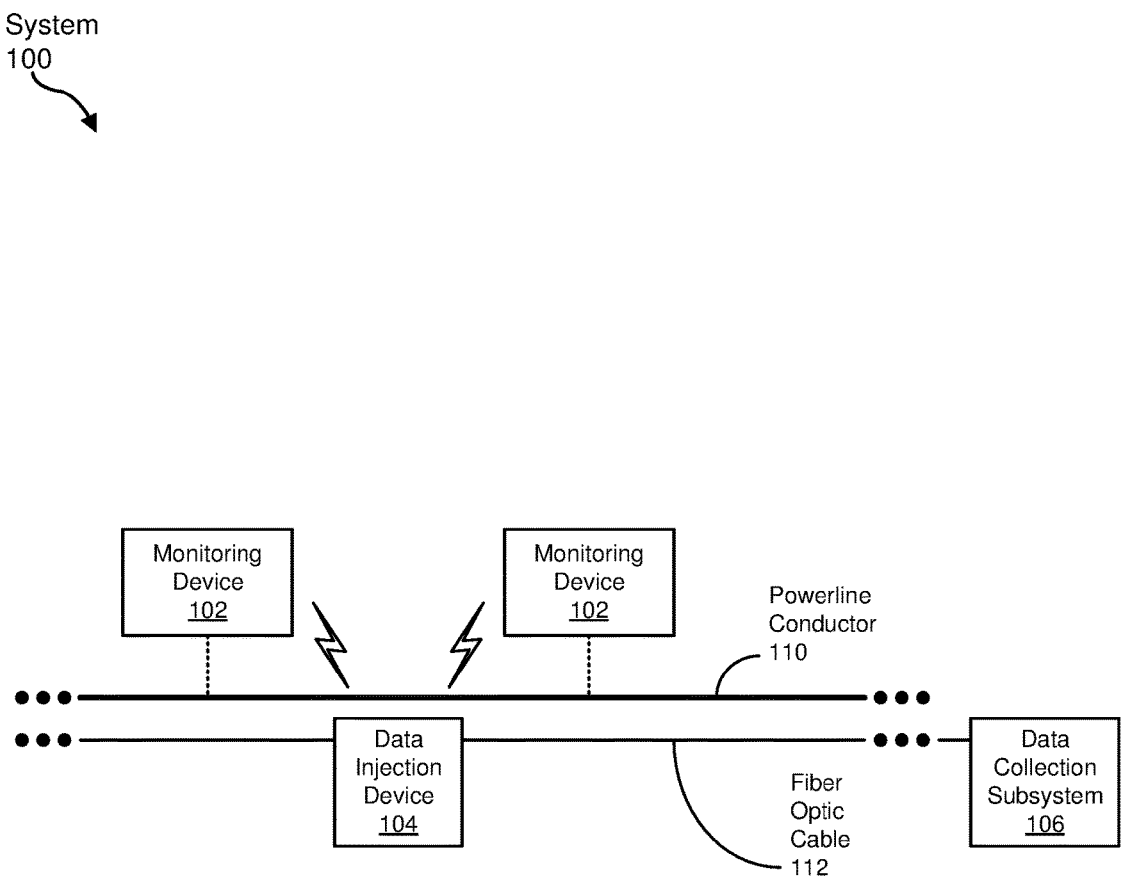
FIG. 1 is a block diagram of an exemplary system for monitoring a powerline conductor using an associated fiber optic cable.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to systems and methods for monitoring a powerline conductor using an associated fiber optic cable. As will be explained in greater detail below, embodiments of the instant disclosure may facilitate use of a fiber optical cable (e.g., a fiber optic cable installed in proximity to the powerline conductor) to carry data regarding one or more characteristics regarding the powerline conductor that are generated by a plurality of monitoring devices distributed along at least a portion of the conductor, thus potentially providing more detailed and more finely-grained information regarding the operational status or condition of the conductor, which may facilitate detailed discovery of failure conditions, service theft, and so on.

The following will provide, with reference to FIGS. 1-7, detailed descriptions of systems and methods for monitoring a powerline conductor using an associated fiber optic cable. Such an exemplary system that may include multiple monitoring devices and a data injection device is discussed in conjunction with FIG. 1. An exemplary monitoring environment that may employ the exemplary system of FIG. 1 is discussed in connection with FIG. 2. An exemplary monitoring device is presented in reference to FIG. 3, and an exemplary data injection system is discussed in connection with FIG. 4. Moreover, in reference to FIG. 5, a description is provided of an exemplary communication timing system employable with either or both of the exemplary monitoring device of FIG. 3 and the data injection device of FIG. 4. In conjunction with FIG. 6, an exemplary method of monitoring a powerline conductor using an associated fiber optic cable is discussed, and an exemplary method of installing a system for monitoring a powerline conductor using an associated fiber optical cable is presented in reference to FIG. 7.

FIG. 1 is a block diagram of an exemplary system 100 for monitoring a powerline conductor 110 using an associated fiber optic cable 112. In some examples, powerline conductor 110 may be an electrical conductor (e.g., a conductive cable) used in an electrical power transmission system (e.g., approximately 110 kilovolt (kV) or greater transmission lines), sub-transmission system (e.g., approximately 35 kV to 110 kV sub-transmission lines), distribution system (e.g., approximately 35 kV or less distribution lines), or any other electrical conductor for providing electrical power. In some embodiments, fiber optic cable 112 may include one or more optical fibers for carrying communication data, where fiber optic cable 112 may be associated with (e.g., mechanically coupled to) powerline conductor 110 in some fashion. For example, fiber optic cable 112 may be helically wrapped about powerline conductor 110 (e.g., as part of an aerial outside plant (aerial OSP) fiber optic cable installation). However, other ways of associating fiber optic cable 112 with powerline conductor 110 are also possible.

As depicted in FIG. 1, system 100 may include multiple monitoring devices 102 that may be distributed at various locations along powerline conductor 110. In at least some examples, each of one or more monitoring devices 102 may include at least one detection component that detects at least one physical characteristic (e.g., instantaneous or near-instantaneous voltage and/or current signals (including transients and/or harmonics in addition to expected sinusoidal waveforms), environmental condition in proximity of monitoring device 102, and so on) at the location of monitoring device 102 along powerline conductor 110. Monitoring device 102 may also include a transmitter that wirelessly transmits data indicating the at least one physical characteristic.

System 100, as indicated in FIG. 1, may also include a data injection device 104 that wirelessly receives the data from one or more monitoring devices 102, transforms the data into an optical signal, and then introduces or injects the optical signal onto fiber optic cable 112 (e.g., an optical fiber of fiber optical cable 112) for transmission to a data collection subsystem 106. In some examples, data collection subsystem may include one or more computer systems (e.g., computer servers) that collect and process the data to detect fault conditions or other anomalies in the status or operation of powerline conductor 110.

Figure 2:
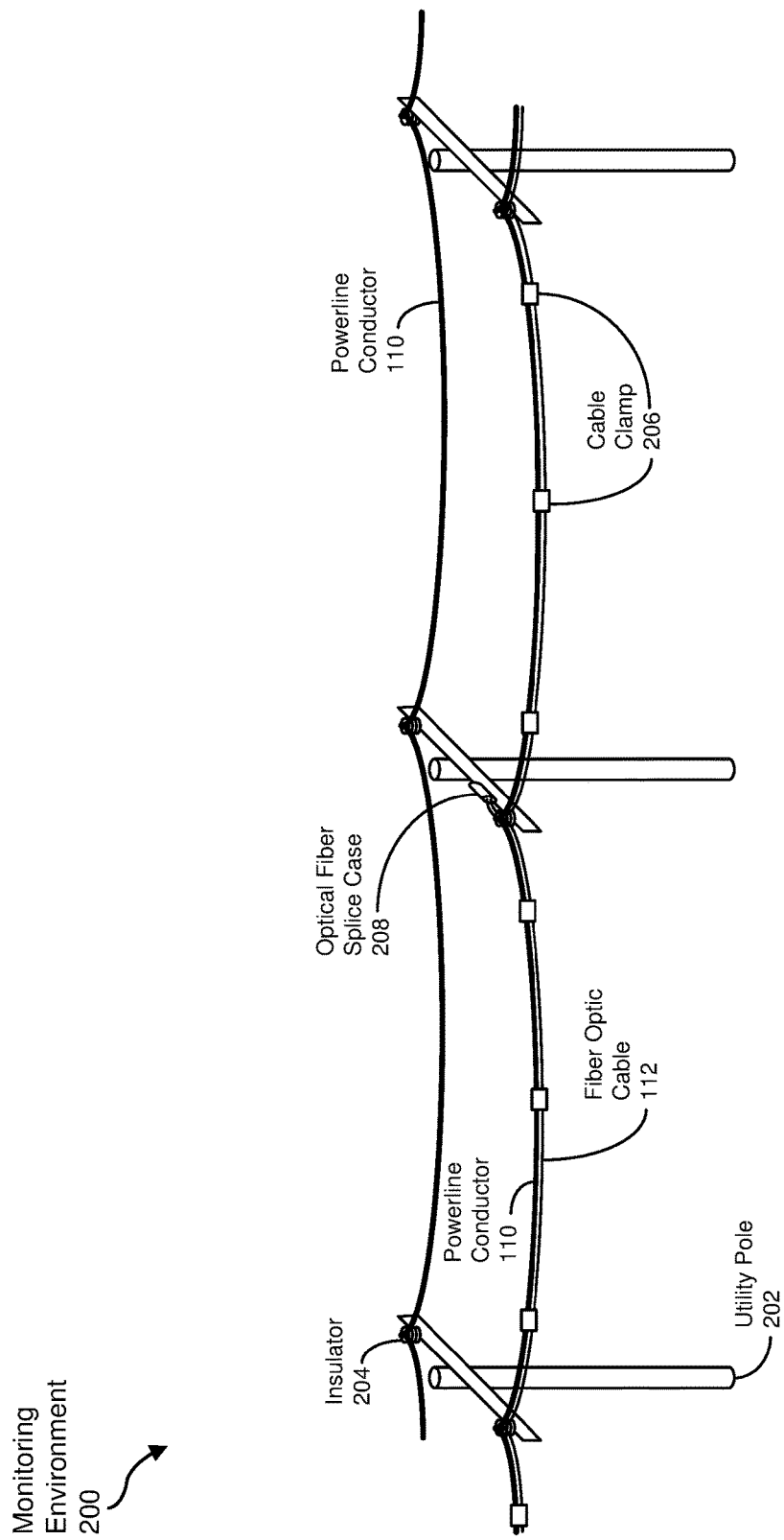
FIG. 2 is a graphical representation of an exemplary monitoring environment in which the exemplary system of FIG. 1 may be utilized.

FIG. 2 is a graphical representation of an exemplary monitoring environment 200 in which system 100 of FIG. 1 may be utilized. As depicted in the example of FIG. 2, monitoring environment 200 may include an electrical power transmission or distribution system having a plurality of utility poles 202 carrying multiple powerline conductors 110. While any number of powerline conductors 110 may be carried via utility poles 202, two powerline conductors 110 are illustrated in FIG. 2 for visual simplicity. In some examples, powerline conductors 110 are mechanically coupled to utility poles 202 via insulators 204, although other types of components (e.g., taps, standoffs, etc.) may be employed in various embodiments.

Also shown in FIG. 2 is fiber optic cable 112 aligned with, and mechanically coupled to, powerline conductor 110. As mentioned above, fiber optic cable 112 may be helically wrapped about powerline conductor 110, such as by way of a human-powered or electrically-powered robotic device. However, other physical relationships between powerline conductor 110 and fiber optic cable 112 are also possible. While only one fiber optic cable 112 is depicted in FIG. 2, multiple powerline conductors 110 employing the same utility poles 202 may each have a corresponding fiber optic cable 112 attached or otherwise coupled thereto. As depicted in FIG. 2, fiber optic cable 112 may be secured to powerline conductor 110 via one or more cable clamps 206. In some examples described in greater detail below, each of one or more cable clamps 206 may include a corresponding monitoring device 102. In some examples, fiber optic cable 112 may follow a powerline conductor 110 associated with a particular phase of the power being transmitted, or may alternate between two or three different phases, such as at phase-to-ground transitions 210 at utility poles 202, to provide some level of monitoring of all three phases with a signal fiber optic cable 112.

In some embodiments, in addition to installing monitoring devices 102 along powerline conductors 110 strung along utility poles 202, as shown in FIG. 2, one or more additional monitoring devices 102 may be installed at the secondary side of transformers (not depicted in FIG. 2) that supply power to customer premises.

Additionally, FIG. 2 illustrates an optical fiber splice case 208 that, in some embodiments, splices corresponding ends of optical fibers of fiber optic cable 112 together. For example, relatively long stretches (e.g., 1 km-long expanses) of fiber optic cable 112 that may be coupled to powerline conductor 110 may be mechanically coupled together, thermally fused together, or otherwise coupled in optical fiber splice case 208, which may include optical couplers, amplifiers, and/or other components to facilitate transmission of optical data signals from one expanse of fiber optic cable 112 to the next. In some examples, such as that shown in FIG. 2, optical fiber splice case 208 may be attached to, or positioned on, a utility pole 202. In some examples, such as that depicted in FIG. 2, optical fiber splice case 208 may be mounted on a lower portion of utility pole 202 (e.g., in a lower-voltage section at a safe distance away from higher-voltage powerline conductor 110 to facilitate installation of optical fiber splice case 208). Additionally, in some embodiments, a phase-to-ground transition 210 may be coupled with each fiber optic cable 112 to be interconnected to provide electrical isolation from powerline conductor 110. However, other locations for optical fiber splice case 208 may also be possible.

Figure 3:
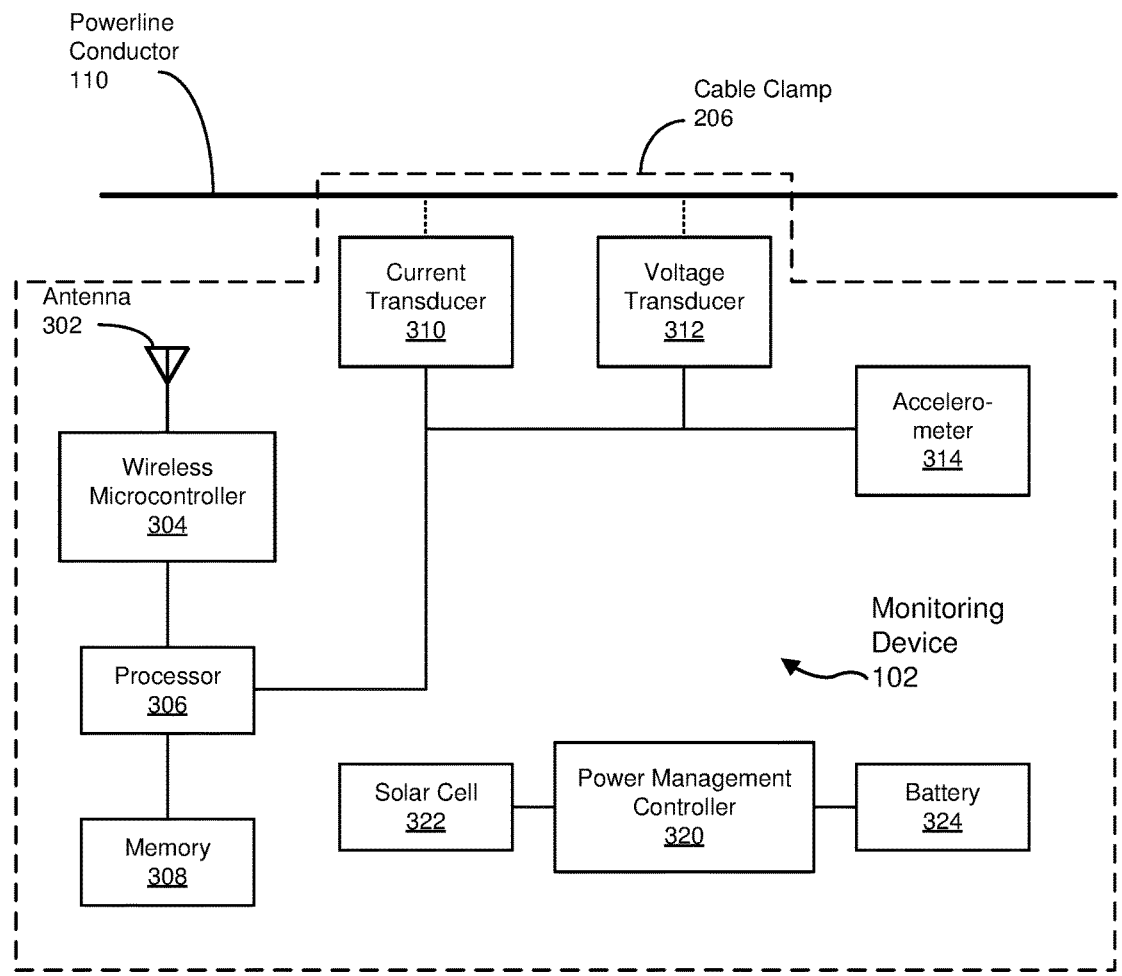
FIG. 3 is a block diagram of an exemplary monitoring device employable in the exemplary system of FIG. 1.

FIG. 3 is a block diagram of an exemplary monitoring device 300 employable in system 100 of FIG. 1. As mentioned above, in some examples, monitoring device 102 may be included in a cable clamp 206 or other clamping device that secures fiber optic cable 112 to powerline conductor 110. As shown in FIG. 3, monitoring device 102 may include one or more detection components (e.g., a current transducer 310, a voltage transducer 312, an accelerometer 314, and/or others). Also in some embodiments, monitoring device 102 may include one or more of a processor 306, memory 308, a wireless microcontroller 304 or other communication device, and/or a power management controller 320 coupled with a solar cell 322 and/or a battery 324.

In some embodiments, the detection components may detect physical characteristics of powerline conductor 110, including characteristics of the electrical power being carried via power conductor 110, such as voltage and current. In some examples, current transducer 310 may include a noncontact current transducer (e.g., a Rogowski coil) arranged around powerline conductor 110 to measure alternating current (AC) current signals. Also in some embodiments, voltage transducer 312 may include a noncontact voltage transducer (e.g., a capacitor divider circuit) arranged in physical proximity to powerline conductor 110 to measure AC voltage signals. The monitoring of such characteristics may aid in identifying the location electrical faults or anomalies (e.g., short circuits, open circuits, degrading portions, and so on) of powerline conductor 110), as well as instances of utility theft in which power is tapped from the electrical grid in an unauthorized manner.

In some embodiments, other types of detection components may measure other physical aspects of powerline conductor 110 not directly associated with the power being carried via powerline conductor 110. For example, the detection components of monitoring device 102 may include components that measure physical movement or force on powerline conductor 110. In one example, accelerometer 314 may detect acceleration of powerline conductor 110 (e.g., aeolian vibration and/or galloping conductors in one or more directions transverse to the longitudinal direction defined by powerline conductor 110), which may be helpful in identifying areas of powerline conductor 110 experiencing undesirable movement (e.g., due to wind or other external factors), changes in line sag, line disconnection, and the like at the location of monitoring device 102. Other detection components (e.g., gyroscopes, strain gauges, etc.) may measure, for example, strain or other forces imposed on powerline conductor 110 at one or more relatively specific locations along powerline conductor 110.

In yet other embodiments, the detection components of monitoring device 102 may include sensors or transducers that detect one or more characteristics of the environment surrounding powerline conductor 110, such as temperature, humidity, wind speed, and the like. Monitoring such characteristics at various locations along powerline conductor 110 may help provide insight regarding future potential problems that may be encountered with powerline conductor 110.

In some examples, one or more of the detection components (e.g., sensors, transducers, and so on) may generate analog or digital indications of the particular characteristics with which they are tasked to measure. For example, current transducer 310, voltage transducer 312, and/or accelerometer 314 may generate an analog voltage, an analog current, a digital data value, or other indication of the characteristic being measured.

Processor 306, in some examples, may be a microprocessor, microcontroller, digital signal processor (DSP), application-specific integrated circuit (ASIC), or other hardware processor that may receive the indications from the detection components. In one example, processor 306 may be a mixed-signal processor. In some examples, processor 306 may sample one or more of the indications from the detection components hundreds or thousands of times per second (e.g., 1 kilo-samples per second (kSps) up to 20 kSps)), while other indications may be sampled less often, such as once per one or more seconds. In some embodiments, processor 306 may include one or more circuits (e.g., digital data ports, analog-to-digital converters (ADCs), and so on) that may transform the indications generated by the detection components into digital values. Additionally, processor 306 may process that data into one or more other forms. For example, processor 306 may generate averages (e.g., isolated averages over distinct time periods, moving averages over consecutive time periods, and/or the like) of the received or sampled digital data from the detection components. Moreover, in some embodiments, processor 306 may generate additional data based on (e.g., derived from) the received indications (e.g., power factor data, harmonic content, and transients based on sampled electrical voltage and current indications). In at least some embodiments, processor 306 may also communicate with wireless microcontroller 304 (e.g., to transmit the resulting data) and/or memory 308 (e.g., to store the resulting data).

Memory 308, in addition to providing storage for data received and/or generated by processor 306, may include instructions to be executed by processor 306 (as well as by wireless microcontroller 304, discussed below) to perform its various functions or tasks, as described in greater detail herein. In one embodiment, memory 308 may be a separate memory component, or may be incorporated within processor 306. Memory 308 generally represents any type or form of volatile or non-volatile storage device or medium capable of storing data and/or computer-readable instructions. In other examples, some functionality described above as performed by processor 306 and/or wireless microcontroller 304 may instead be performed by special-purpose circuitry included in monitoring device 102.

Wireless microcontroller 304, in some examples, may be a controller component that employs a wireless communication protocol to transmit and/or receive data wirelessly. More specifically, in at least some embodiments, wireless microcontroller 304 may receive the data representing the at least one characteristic detected by the detection components, as sampled, processed, or otherwise generated by processor 306, and transmits that data wirelessly (e.g., to data injection device 104). In some embodiments, wireless microcontroller 304 may employ an antenna 302 for the wireless transmission and/or reception of data. Examples of the wireless communication protocol implemented by wireless microcontroller 304 may include, but are not limited to, Zigbee®, Wi-Fi, IEEE 802.15.4E/G (e.g., for low-rate wireless personal area networks (LR-WPANs)), and Bluetooth®. In some embodiments, wireless microcontroller 304 may also include logic that routes data generated, as well as received, by monitoring device 102 to another monitoring device 102 or data injection device 104. In some embodiments, a single component may function as both processor 306 and wireless microcontroller 304.

In some examples, wireless microcontroller 304 may also wirelessly transmit data to, and/or receive data from, another monitoring device 102 (e.g., using wireless microcontroller 304 and antenna 302). For example, the distance between one or more monitoring devices 102 and data injection device 104 may exceed the communication capabilities of wireless microcontroller 304. Accordingly, one monitoring device 102 may transmit its data indicating the at least one detected physical characteristic to another monitoring device 102, which may receive and retransmit that data wirelessly (e.g., to data injection device 104 or yet another monitoring device 102). Additionally, in some embodiments, monitoring devices 102 and/or data injection device 104 may receive smart meter data or data from other utility metering infrastructure (e.g., via Zigbee®, IEEE 802.15.4E/G, etc.) and inject that data along with the monitoring data onto an optical fiber of fiber optic cable 112, as described in greater detail below.

Power management controller 320, in some embodiments, may employ either or both solar cell 322 and/or battery 324 to provide power (e.g., without a wired connection to an external electrical power source) for monitoring device 102, including, but not limited to, wireless microcontroller 304, processor 306, memory 308, current transducer 310, voltage transducer 312, and/or accelerometer 314. For example, power management controller 320 may direct energy generated by solar cell 322 to battery 324 for storage and/or to other components of monitoring device 102. Power management controller 320 may also supply power for monitoring device 102 from energy stored in battery 324 when less than sufficient energy is available via solar cell 322. In other examples, monitoring device 102 may employ an inductive current transformer, electrostatic series capacitor, or one or more other components to leach power from the current flow in powerline conductor 110 for operating monitoring device 102. Moreover, in some embodiments, power management controller 320 may selectively operate various components monitoring device 102, such as by placing one or more such components in a low-power or no-power state for periods of time to reduce overall energy consumption. Some examples of power management controller 320 may include a battery charger circuit, a maximum power point tracker (MPPT), and/or a low-dropout regulator (LDO).

Each monitoring device 102 may be included in a cable clamp 206 that clamps fiber optic cable 112 to powerline conductor 110, thus restricting relative movement between fiber optic cable 112 and powerline conductor 110 in the area of cable clamp 206, thus reducing friction or other forces between the two that may lead to damage to either fiber optic cable 112 or powerline conductor 110. In some embodiments, cable clamp 206 may encompass monitoring device 102 in a substantially weathertight container, and may retain the components of monitoring device 102 in a configuration such that one or more of the components (e.g., current transducer 310 and/or voltage transducer 312) are in sufficient proximity to powerline conductor 110 to perform their corresponding detection functions. Also, in some examples, cable clamp 206 may configured with an eye bolt or other mechanism such that cable claim 206 may be installed on powerline conductor 110 and fiber optic cable 112 by way of a "hot stick" or other device to ensure safety from possible electric shock.

Figure 4:
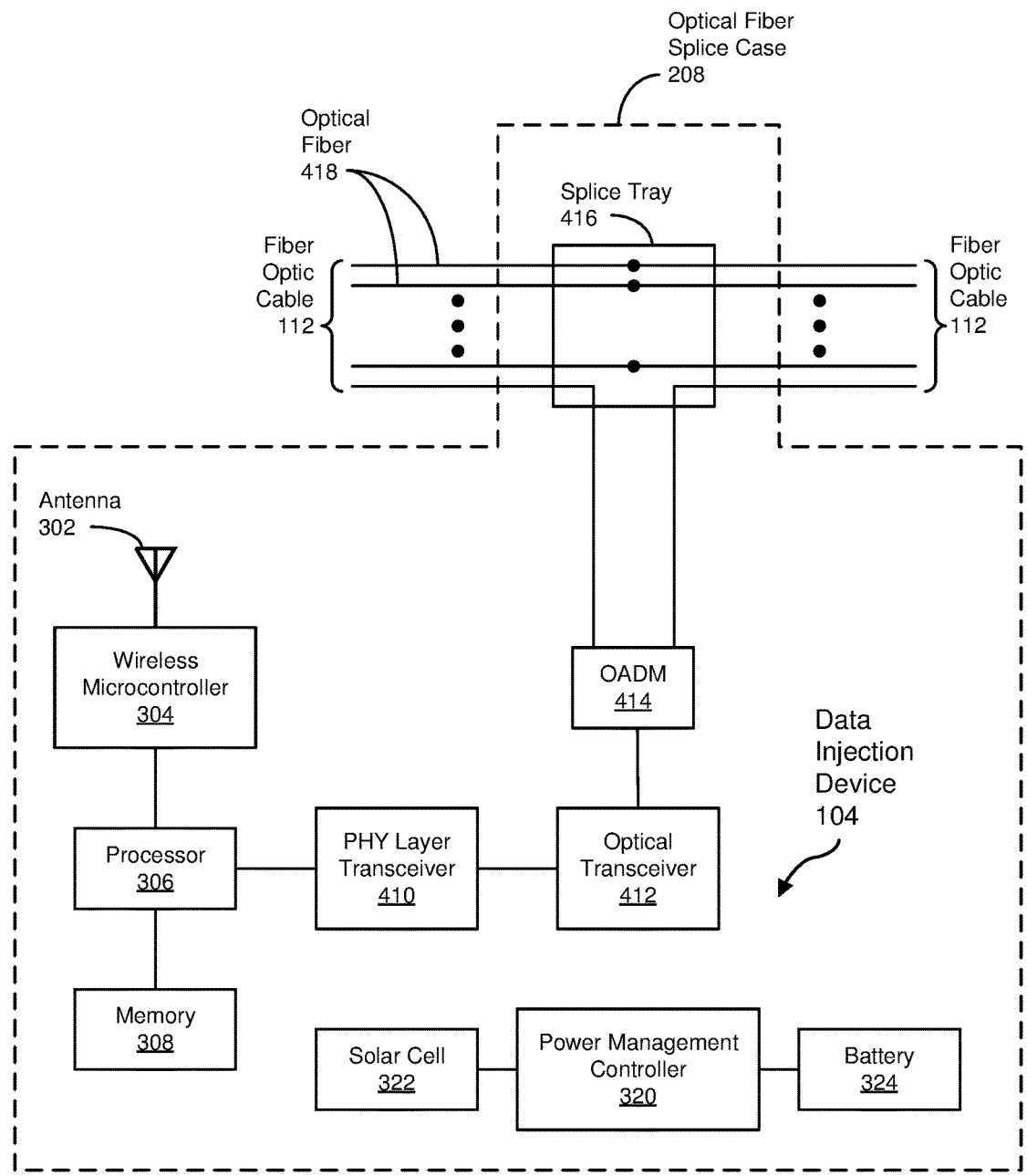
FIG. 4 is a block diagram of an exemplary data injection device employable in the exemplary system of FIG. 1.

FIG. 4 is a block diagram of an exemplary data injection device 104 employable in system 100 of FIG. 1. In some examples, data injection device 104 may include antenna 302, wireless microcontroller 304, processor 306, and memory 308 that may be the same as, or similar to, the corresponding components of monitoring device 102 of FIG. 3. In some embodiments, wireless microcontroller 304, using antenna 302, may wirelessly receive data from one or more monitoring devices 102, such as data indicating some aspect of the at least one physical characteristic detected by the detection components of monitoring devices 102. In some examples, the received data may be stored for some period of time in memory 308 prior to data injection device 104 injecting the data onto an optical fiber of fiber optic cable 112.

As indicated above, data injection device 104, in some embodiments, may be installed within an optical fiber splice case 208. Further, in some examples, optical fiber splice case 208 may include a splice tray 416 that holds mechanically-coupled, or fusion-spliced, ends of one or more optical fibers 418 of a section of fiber optic cable 112 to an end of corresponding optical fibers 418 of another section of fiber optic cable 112 to provide a continuous optical data path. In some embodiments, a single optical fiber 418 may be employed to carry data received from one or more monitoring devices 102 while the remaining optical fibers 418 (e.g., 24 optical fibers 418) may carry communication traffic not originating from, or otherwise associated with, monitoring devices 102.

In some examples, data injection device 104 may include an electrical-to-optical signal converter circuit that transforms the data (e.g., digital data) received from monitoring devices 102 into an optical signal in preparation for introduction onto an optical fiber 418. In some embodiments, as depicted in FIG. 4, the electrical-to-optical signal converter may include a physical (PHY) layer transceiver 410 and an optical transceiver 412. An example of the PHY layer transceiver 410 may be a type of electronic interface protocol transceiver the converts the data into an electronic interface protocol signal, such as an Ethernet physical layer transceiver. Optical transceiver 412, in some examples, may be communicatively coupled to PHY layer transceiver 410 and may transform the electronic interface protocol signal generated by PHY layer transceiver 410 into an optical signal (e.g., a single-wavelength optical signal). More specifically, in one example, optical transceiver 412 may be a single-fiber, single-wavelength (SFSW) coarse wavelength-division multiplexing (CWDM) small form-factor pluggable (SFP) 100-megabit (Mbit) Ethernet optical transceiver.

To inject the resulting optical signal from optical transceiver 412 onto one of the optical fibers 418 of fiber optic cable 112, data injection device 104 may include an optical add/drop multiplexer (OADM) 414 coupled to an end of the one of the optical fibers 418 of each section of fiber optic cable 112 being spliced together at optical fiber splice case 208. In some examples, OADM 414 may inject data from optical transceiver 412 onto a spare or otherwise unused wavelength or wavelength band of an incoming optical fiber 418 while passing the remaining wavelengths that may be carrying other data (e.g., data from another data injection device 104) through to corresponding optical fiber 418 of the outgoing section of fiber optical cable 112 (e.g., for transmission to data collection subsystem 106). Meanwhile, in at least some examples, splice tray 416 may facilitate the optical coupling of one or more wavelengths of optical data carried on the remaining optical fibers 418 from the incoming section to the outgoing section of fiber optic cable 112.

In a manner similar to that described above with respect to monitoring device 102 of FIG. 4, data injection device 104 may include power management controller 320, solar cell 322, and/or battery 324 for the generation, storage, and/or distribution of electrical power for operating the various components of data injection device 104, such as wireless microcontroller 304, processor 306, memory 308, PHY layer transceiver 410, optical transceiver 412, and/or OADM 414. In other examples, data injection device 104 may leach power from the current flow in powerline conductor 110 (e.g., using a current transformer built into a phase-to-ground transition 210, such as might be located near optical fiber splice case 208, as illustrated in FIG. 2).

Figure 5:
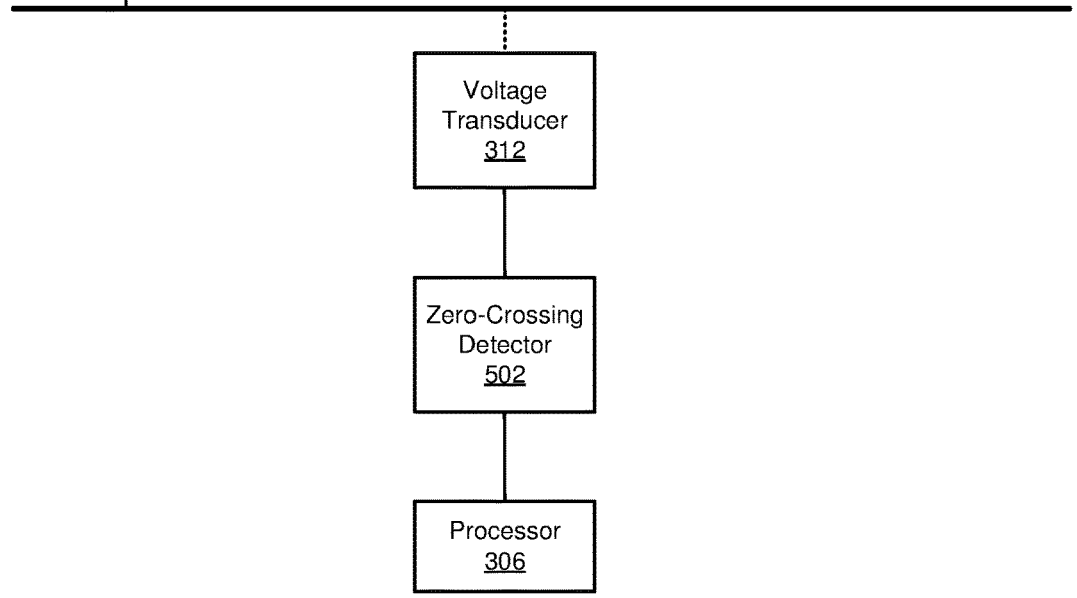
FIG. 5 is a block diagram of an exemplary timing control subsystem employable with either or both the exemplary monitoring device of FIG. 3 and the exemplary data injection device of FIG. 4.

FIG. 5 is a block diagram of an exemplary communication timing subsystem 500 employable in either or both monitoring device 102 of FIG. 3 and phase-to-ground transitions 210 coupled with data injection device 104 of FIG. 4. As shown in FIG. 5, communication timing subsystem 500 may include a zero-crossing detection 502 in addition to voltage transducer 312 and processor 306 (introduced above). As described above, in some examples, voltage transducer 312 may detect a current AC voltage signal of electrical power carried on powerline conductor 110 over time, such as in a continuous or sampled manner, and generate an analog voltage, digital data, or the like indicating the current AC voltage signal. In turn, zero-crossing detector 502 may determine points in time at which the current AC voltage signal crosses a zero or midpoint threshold. In some examples, zero-crossing detector 502 may also indicate whether the detected zero crossing is a low-to-high or high-to-low zero-crossing of the AC voltage. In some embodiments, processor 306 may control the timing of wireless communication between one monitoring device 102 and another, or between one or more monitoring devices 102 and data injection device 104, to reduce the overall percentage of time during which wireless communication occurs. Such reduction may be possible since wireless communication between devices 102, 104 residing on the same powerline conductor 110 may be synchronized to each other based on the zero-crossing information, which is based on the same AC voltage carried on powerline conductor 110. For example, multiple monitoring devices 102 and/or data injection device 104 may attempt to communicate wirelessly in response to each zero-crossing of the AC voltage, each positive or negative zero-crossing, every nth zero-crossing, or the like. In some examples, the zero-crossing timing information may also be employed by power management controller 320 to control power consumption of the various components of monitoring device 102 and/or data injection device 104 to reduce overall power consumption during time periods when monitoring device 102 and/or data injection device 104 are not communicating wirelessly. In some examples associated with the use of communication timing subsystem 500 at data injection device 104, phase-to-ground transition 210 may include voltage transducer 312 and zero-crossing detector 502, which may transmit zero-crossing information for timing purposes via a dielectric light guide to processor 306 of data injection device 104 located in optical fiber splice case 208.

Figure 6:
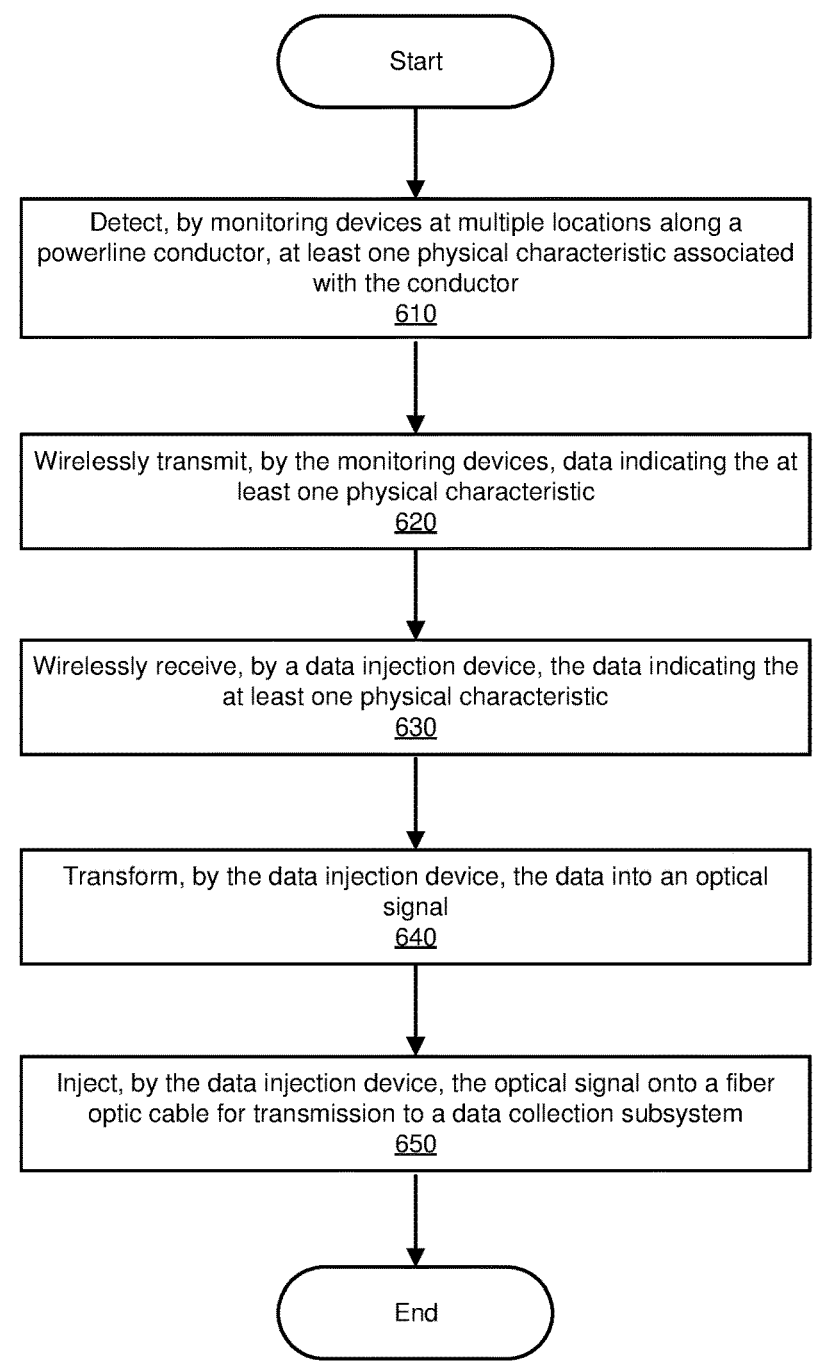
FIG. 6 is a flow diagram of an exemplary method for monitoring a powerline conductor using an associated fiber optic cable.

FIG. 6 is a flow diagram of an exemplary method 600 for monitoring a powerline conductor (e.g., powerline conductor 110) using an associated fiber optic cable (e.g., fiber optic cable 112). In some examples, method 600 may be performed by a combination of one or more monitoring devices (e.g., monitoring devices 102) and a data injection device (e.g., data injection device 104). In the method 600, at step 610, multiple monitoring devices at multiple locations along a powerline conductor may each detect at least one physical characteristic associated with the powerline conductor. At step 620, in some examples, data indicating the at least one physical characteristic may be wirelessly transmitted by the monitoring devices. At step 630, the data injection device may wirelessly receive the wirelessly transmitted data indicating the at least one physical characteristic. In some embodiments, the data injection device may wirelessly receive the data from the monitoring device that generated the data, or may wirelessly receive the data from a monitoring device that relayed the data from another monitoring device that originally generated that data. In some examples, the data injection device may then transform the received data into an optical signal at step 640, and inject the optical signal onto a fiber optic cable at step 650 for transmission to a data collection subsystem (e.g., data collection subsystem 106). In some embodiments, the timing of the wireless data transmissions and receptions may be based on the timing of a particular signal available to the monitoring device and/or the data injection device, such as the AC voltage (or current) waveform carried by the powerline conductor.

Figure 7:
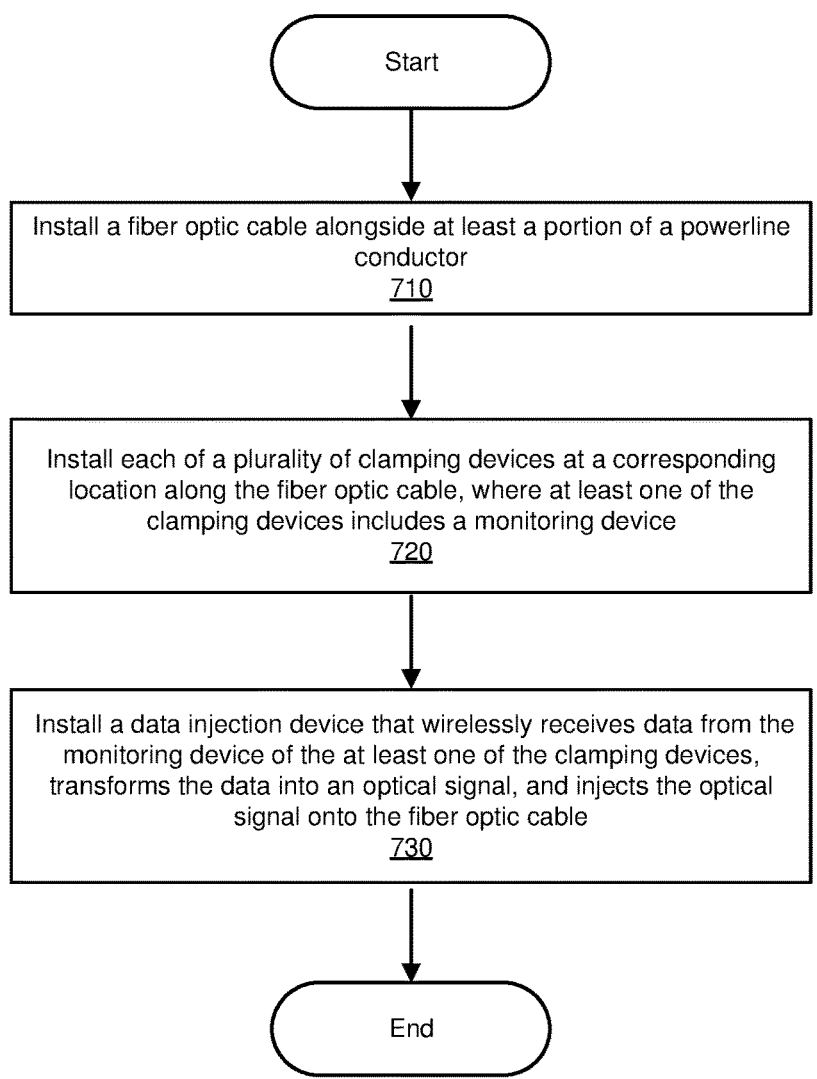
FIG. 7 is a flow diagram of an exemplary method of installing a system for monitoring a powerline conductor using an associated fiber optic cable.

FIG. 7 is a flow diagram of an exemplary method 700 of installing a system (e.g., system 100) for monitoring a powerline conductor (e.g., powerline conductor 110) using an associated fiber optic cable (e.g., fiber optic cable 112). In some embodiments, at step 710, a fiber optic cable may be installed alongside at least a portion of a powerline conductor. Further, in some examples, at step 720, each of a plurality of clamping devices (e.g., cable clamps 206) may be installed at a corresponding location along the fiber optic cable, where at least one of the clamping devices includes a monitoring device (e.g., monitoring device 102). In some embodiments, at step 730, a data injection device (e.g., data injection device 104) may be installed that wirelessly receives data from the monitoring device of the at least one of the clamping devices, transforms the data into an optical signal, and injects the optical signal onto the fiber optic cable.

The steps shown in FIGS. 6 and 7, as well as other tasks performed by monitoring device 102 and data injection device 104, may be performed by any suitable computer-executable code and/or computing system, including wireless microcontroller 304 and processor 306 in conjunction with memory 308, as described above. In one example, each of the steps shown in FIGS. 6 and 7 may represent an algorithm whose structure includes and/or is represented by multiple sub-steps, examples of which are described above in greater detail.

As explained above in conjunction with FIGS. 1 through 7, the systems and methods described herein may facilitate relatively fine-grained monitoring of one or more physical characteristics (e.g., with respect to time and location) of a powerline conductor by way of monitoring devices distributed along the powerline conductor that generate data based on the monitored physical characteristics, and by way of data injection devices that receive that data wirelessly from the monitoring devices and inject that data onto an optical fiber of a nearby fiber optic cable. In some examples, the various devices may be included in infrastructure (e.g., cable clamps, optical fiber splice cases, etc.) employed when installing a fiber optic cable in an aerial OSP environment, in which an electrical transmission or distribution system is leveraged to add fiber optic communication capacity to a geographic area. Consequently, in some examples, the additional costs of providing the fiber optic cable may be offset by the financial benefits possibly provided by the addition of the resulting electrical grid monitoring network that includes the monitoring devices, such as by detecting failure conditions, utility service theft, and the like.

As detailed above, the computing devices and systems described and/or illustrated herein broadly represent any type or form of computing device or system capable of executing computer-readable instructions, such as those contained within the modules described herein. In their most basic configuration, these computing device(s) may each include at least one memory device and at least one physical processor.

In some examples, the term "memory device" generally refers to any type or form of volatile or non-volatile storage device or medium capable of storing data and/or computer-readable instructions. In one example, a memory device may store, load, and/or maintain one or more computer-executable modules designed to accomplish the computer-executable tasks described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some examples, the term "physical processor" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A system comprising:
    a plurality of clamping devices that clamp a fiber optic cable to a powerline conductor at different locations along the powerline conductor, wherein each of the plurality of clamping devices comprises a monitoring device comprising:
        at least one detection component that detects at least one physical characteristic at the location of the monitoring device;
        a transmitter that wirelessly transmits data indicating the at least one physical characteristic; and
        a receiver that wirelessly receives data indicating the at least one physical characteristic from at least one other monitoring device, wherein the transmitter retransmits the data indicating the at least one physical characteristic from the at least one other monitoring device; and
    an optical fiber splice case comprising a data injection device that:
        wirelessly receives the data indicating the at least one physical characteristic detected by the monitoring devices at the different locations along the powerline conductor;
        transforms the data into an optical signal; and
        injects the optical signal onto the fiber optic cable for transmission to a data collection subsystem.

2. The system of claim 1, wherein:
    the monitoring devices of the plurality of clamping devices form a wireless communication network.

3. The system of claim 1, wherein the at least one physical characteristic comprises at least one electrical characteristic of power carried on the powerline conductor.

4. The system of claim 3, wherein the at least one electrical characteristic of power carried on the powerline conductor comprises at least one of:
    voltage; or
    current.

5. The system of claim 1, wherein the at least one physical characteristic comprises at least one characteristic of an environment including the powerline conductor.

6. The system of claim 5, wherein the at least one characteristic of the environment including the powerline conductor comprises at least one of:
    temperature;
    humidity; or
    wind speed.

7. The system of claim 1, wherein:
    the fiber optic cable comprises a first section and a second section; and
    the optical fiber splice case comprises a splice tray that optically couples ends of corresponding optical fibers of the first section and the second section of the fiber optic cable.

8. The system of claim 7, wherein the data injection device comprises:
    an electrical-to-optical signal converter that transforms the data into the optical signal; and
    an optical add/drop multiplexer that injects the optical signal onto a single wavelength of a single fiber of the optical fibers of the first section or the second section of the fiber optic cable.

9. The system of claim 8, wherein the electrical-to-optical signal converter comprises:
    an electronic interface protocol transceiver that converts the data into an electronic interface protocol signal; and
    a single-fiber, single-wavelength optical transceiver that transforms the electronic interface protocol signal into a single-wavelength optical signal.

10. The system of claim 9, wherein the single-fiber, single-wavelength transceiver comprises a small form-factor pluggable transceiver.

11. The system of claim 1, wherein at least one of the monitoring devices comprises:
    a detection circuit that detects a characteristic of power carried on the powerline conductor; and
    a communication timing circuit that causes the transmitter of the at least one of the monitoring devices to wirelessly transmit the data indicating at least one physical characteristic at the location of each of the at least one of the monitoring devices along the powerline conductor according to a timing that is based on the characteristic of power carried on the powerline conductor.

12. The system of claim 11, wherein the characteristic of power carried on the powerline conductor detected by the detection circuit comprises a zero-crossing of a voltage carried on the powerline conductor.

13. The system of claim 11, wherein the data injection device comprises:
    a detection circuit that detects a characteristic of power carried on the powerline conductor; and
    a communication timing circuit that causes the data injection device to wirelessly receive the data indicating the at least one physical characteristic from at least one of the monitoring devices according to the timing that is based on the characteristic of power carried on the powerline conductor.

14. The system of claim 1, wherein one or more of the at least one detection component of at least one of the monitoring devices samples the at least one physical characteristic multiple times per cycle of a current or a voltage carried by the powerline conductor.

15. A method comprising:
   detecting, by a plurality of monitoring devices, at least one physical characteristic associated with a powerline conductor, wherein each of a plurality of clamping devices that clamps a fiber optic cable to the powerline conductor at different locations along the powerline conductor comprises one of the plurality of monitoring devices;
   wirelessly transmitting, by each of the plurality of monitoring devices, data indicating the at least one physical characteristic associated with the powerline conductor detected at the associated monitoring device;
   wirelessly receiving and retransmitting, by at least one of the plurality of monitoring devices, a portion of the data indicating the at least one physical characteristic associated with the powerline conductor detected by at least one other of the plurality of monitoring devices;
   wirelessly receiving, by a data injection device of an optical fiber splice case, the data indicating the at least one physical characteristic associated with the powerline conductor detected at the plurality of monitoring devices;
   transforming, by the data injection device, the data into an optical signal; and
   injecting, by the data injection device, the optical signal onto the fiber optic cable for transmission to a data collection subsystem.

16. The method of claim 15, wherein:
   the plurality of monitoring devices form a wireless communication network.

17. The method of claim 15, further comprising:
   detecting, by at least one of the plurality of monitoring devices, a characteristic of power carried on the powerline conductor, wherein a timing of wirelessly transmitting the data indicating the at least one physical characteristic associated with the powerline conductor by the at least one of the plurality of monitoring devices is based on detecting the characteristic of power carried on the powerline conductor.

18. A method comprising:
installing a fiber optic cable alongside at least a portion of a powerline conductor; and
installing each of a plurality of clamping devices at a corresponding location along the fiber optic cable to secure the fiber optic cable to the powerline conductor, wherein each of multiple ones of the plurality of clamping devices comprises a monitoring device that:
   detects at least one physical characteristic associated with the powerline conductor at the corresponding location along the fiber optic cable;
   wirelessly transmits data indicating the at least one physical characteristic associated with the powerline conductor detected at the corresponding location along the fiber optic cable; and
   wirelessly receives and retransmits at least a portion of the data indicating at least one physical characteristic associated with the powerline conductor detected at one or more other locations along the fiber optic cable.

19. The method of claim 18, further comprising:
installing an optical fiber splice case comprising a data injection device that:
   wirelessly receives the data indicating the at least one physical characteristic;
   transforms the data into an optical signal; and
   injects the optical signal onto the fiber optic cable for transmission to a data collection subsystem.

* * * * *